(12) United States Patent
Yoshimura et al.

(10) Patent No.: US 8,334,338 B2
(45) Date of Patent: Dec. 18, 2012

(54) COMPOSITION FOR FORMING RESIST LOWER LAYER FILM

(75) Inventors: Nakaatsu Yoshimura, Tokyo (JP); Yousuke Konno, Tokyo (JP)

(73) Assignee: JSR Corporation, Tokyo (JP)

( * ) Notice: Subject to any disclaimer, the term of this patent is extended or adjusted under 35 U.S.C. 154(b) by 267 days.

(21) Appl. No.: 12/599,694

(22) PCT Filed: May 21, 2008

(86) PCT No.: PCT/JP2008/059387
§ 371 (c)(1), (2), (4) Date: Nov. 11, 2009

(87) PCT Pub. No.: WO2008/143302
PCT Pub. Date: Nov. 27, 2008

(65) Prior Publication Data
US 2011/0251323 A1 Oct. 13, 2011

(30) Foreign Application Priority Data
May 23, 2007 (JP) ................................. 2007-137012

(51) Int. Cl.
*A61K 9/16* (2006.01)
*C08K 5/10* (2006.01)
(52) U.S. Cl. ....................................... 524/543; 524/317
(58) Field of Classification Search .................... 524/543
See application file for complete search history.

(56) References Cited

U.S. PATENT DOCUMENTS

| 6,057,239 | A | 5/2000 | Wang et al. |
| 6,316,165 | B1 | 11/2001 | Pavelchek et al. |
| 6,461,717 | B1 | 10/2002 | Rutter et al. |
| 7,371,510 | B2 * | 5/2008 | Hirayama et al. ............ 430/326 |
| 2002/0022196 | A1 | 2/2002 | Pavelchek et al. |
| 2002/0110665 | A1 | 8/2002 | Rutter et al. |
| 2003/0032280 | A1 | 2/2003 | Iguchi et al. |
| 2003/0146416 | A1 | 8/2003 | Takei et al. |
| 2004/0034155 | A1 * | 2/2004 | Sugita et al. .................. 524/543 |
| 2006/0228646 | A1 | 10/2006 | Zampini et al. |
| 2007/0190459 | A1 | 8/2007 | Hashimoto et al. |
| 2009/0053647 | A1 | 2/2009 | Enomoto et al. |

FOREIGN PATENT DOCUMENTS

| JP | 2000-143937 | 5/2000 |
| JP | 2000-294504 | 10/2000 |
| JP | 2001-40293 | 2/2001 |
| JP | 2002-47430 | 2/2002 |
| JP | 2002-329781 | 11/2002 |
| JP | 2003-57828 | 2/2003 |
| JP | 2004-168748 | 6/2004 |
| JP | 2006-341590 | 12/2006 |
| JP | 2007-241259 | 9/2007 |
| WO | WO 2006/132088 | 12/2006 |

OTHER PUBLICATIONS

Benedek ed., Developments in Pressure-Sensitive Products, published by CRC Press, 2006.*
Japanese Office Action for corresponding JP Application No. 2009-515266, Jun. 19, 2012.

* cited by examiner

*Primary Examiner* — Hui Chin
(74) *Attorney, Agent, or Firm* — Ditthavong Mori & Steiner, P.C.

(57) ABSTRACT

A composition for forming a resist lower layer film, which contains (A) a resin, (B) a butyl ether group-containing crosslinking agent and (C) a solvent.

3 Claims, 2 Drawing Sheets

COMPOSITION FOR FORMING RESIST LOWER LAYER FILM

TECHNICAL FIELD

The present invention relates to a composition for forming a resist lower layer film, which is used for formation of a resist lower layer film which becomes a lower layer of resist film. Specifically, the present invention relates to a composition for forming a resist lower layer film, which, when used to a substrate of large aspect ratio (e.g. a substrate having minute holes and trenches, used in formation of a multilayer wiring structure), shows a property of being easily filled in the gaps of the substrate, i.e. a superior filling property.

BACKGROUND ART

The process for producing a semiconductor includes a step of forming, on a silicon wafer, a plurality of to-be-processed film layers each made of a substance having different properties, in a given order and subjecting the to-be-processed films to given patterning. The patterning of each to-be-processed film is conducted by first forming, on the surface of the to-be-processed film, a resist film made of a photosensitive substance (a resist), applying a light on given parts of the resist film, then removing the exposed or unexposed parts of the resist film by a development procedure to form a resist pattern, further dry-etching the to-be-processed film using the resist pattern as an etching mask.

In such a process, an ultraviolet light (e.g. an ArF excimer laser) is used as a light source for applying a light on the resist film. Currently, the demand for making finer the large scale integrated circuit (LSI) is becoming increasingly higher and there are cases that the required resolution is the wavelength of exposed light or less. A resolution of the wavelength of exposed light or less is undesirable because there is a shortage in light exposing process tolerance such as exposure amount tolerance, focus tolerance and the like. In order to make up the shortage in exposure process tolerance, it is effective to make small the thickness of the resist film and increase the resolution. However, a reduction in the thickness of the resist film makes it difficult to secure a resist film thickness required in the etching of the to-be-processed film.

Hence, there is being investigated a process which comprises forming, on the surface of a to-be-processed film, a resist lower layer film (hereinafter, this film may be expressed simply as "lower layer film"), transferring a resist pattern once onto the lower layer film to form a lower layer film pattern, and then transferring the resist pattern onto the to-be-processed film using the lower layer film pattern as an etching mask. The lower layer film used in this process preferably has an etching resistance; therefore, it has been proposed to form a lower layer film by using a composition which contains an acenaphthylene skeleton-containing polymer capable of absorbing the energy in etching and exhibiting an etching resistance (see, for example, Patent Literatures 1 to 3).

In an LSI pattern rule having a fineness of 0.13 μm or less, the influence of wiring delay on the high speed of LSI is larger and it is difficult to achieve a higher performance of LSI by using the current process technique of LSI. Hence, it is being investigated to change the wiring material from Al to Cu in order to reduce the wiring delay.

Dual damascene process is known as a technique for changing the wiring material from Al to Cu (see, for example, Patent Literature 4). In this process, a substrate of large aspect ratio (unevenness) needs to be used as compared with when Al is used as the wiring material; and the composition used for formation of resist lower layer film is required to have a property of being easily filled in the gaps of the substrate, i.e. a superior filling property.

In order to improve the filling property of the composition for formation of resist lower layer film, there are known, for example, a method of allowing the resin contained in the composition, to have a molecular weight of 3,000 or less (see, for example, Patent Literature 5); a method of allowing the composition to have a coefficient H indicated by [logarithmic change of viscosity (mPas)]/[change of solid content (mass %)], of 0.06 or less and a viscosity measured at a solid content of 25 mass %, of 1 to 80 mPas (see, for example, Patent Literature 6); and a method of compounding, in the composition, a nitrogen-containing compound (a crosslinking agent) having a molecular weight of 800 or less (see, for example, Patent Literature 7).

Patent Literature 1: JP-A-2000-143937
Patent Literature 2: JP-A-2001-40293
Patent Literature 3: JP-A-2004-168748
Patent Literature 4: U.S. Pat. No. 6,057,239
Patent Literature 5: JP-A-2000-294504
Patent Literature 6: JP-A-2003-057828
Patent Literature 7: JP-A-2002-329781

DISCLOSURE OF THE INVENTION

However, in the method described in the Patent Literature 5, the resin was required to have a glass transition temperature of 130° C. or lower in order for the composition to have an improved filling property. Any resin having a glass transition temperature of 130° C. or higher, even if the molecular weight of the resin was reduced, could not give a composition showing an improved filling property to, in particular, a substrate having an aspect ratio of 3 or more.

When there was used a resin having a glass transition temperature of 130° C. or lower, the composition using the resin showed an improved filling property; however, there was a problem that the etching resistance of lower layer film (this is an important property of the composition together with the filling property) was insufficient. Further, reduction alone in molecular weight of resin was unable to give a composition capable of exhibiting a sufficient filling property to a substrate having both holes and trenches, that is, there was no sufficient filling to both of the holes and the trenches.

The method described in the Patent Literature 6 had a problem that the etching resistance of the lower layer film was insufficient. Originally, this method is an invention relating to an anti-reflection film (BARC=bottom anti reflective coating) for achieving a lower etching resistance relative to a resist.

The method described in the Patent Literature 7 had a problem that the etching resistance of lower layer film was insufficient. Also, there was an inconvenience that, in formation of a lower layer film, the nitrogen-containing compound and/or the decomposition product thereof sublimated, which stained the film formation apparatus used.

Thus, there has yet been disclosed no composition for formation of resist lower layer film, which has a filling property to the gaps of substrate, gives a lower layer film having etching resistance, and can prevent the staining of the film formation apparatus used. The present invention has been made in view of the above-mentioned problems of the prior art, and provides a composition for formation of resist lower layer film, which has a filling property to the gaps of substrate, gives a lower layer film having etching resistance, and can effectively prevent the staining of the film formation apparatus used.

The present inventors made a study in order to solve the above-mentioned problems and, as a result, found that the problems of the prior art could be solved by compounding a butyl ether group-containing crosslinking agent in a composition for formation of resist lower layer film. The finding has led to the completion of the present invention. Specifically, the present invention provides the following composition for formation of resist lower layer film.

[1] A composition for forming a resist lower layer film, which contains (A) a resin, (B) a butyl ether group-containing crosslinking agent and (C) a solvent.

[2] The composition for forming a resist lower layer film, set forth in [1], wherein the butyl ether group-containing crosslinking agent (B) is a nitrogen-containing cyclic compound having at least two butyl ether groups.

[3] The composition for forming a resist lower layer film, set forth in [2], wherein the nitrogen-containing cyclic compound is a compound having a glycoluril skeleton or a triazine skeleton.

[4] The composition for forming a resist lower layer film, set forth in [1], wherein the butyl ether group-containing crosslinking agent (B) is at least one kind of compound selected from the group of the compounds represented by the following formulas (1) and (2).

[Chemical formula 1]

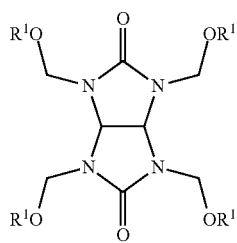

(1)

[$R^1$s are each independently a hydrogen atom, a methyl group, an ethyl group, a propyl group or a butyl group, with a proviso that at least two $R^1$s are each a butyl group.]

[Chemical formula 2]

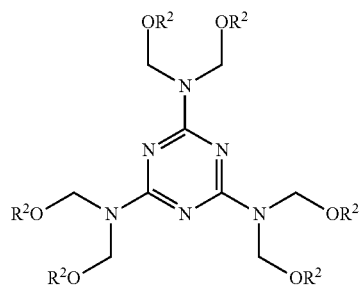

(2)

[$R^2$s are each independently a hydrogen atom, a methyl group, an ethyl group, a propyl group or a butyl group, with a proviso that at least two $R^2$s are each a butyl group.]

[5] A composition for forming a resist lower layer film, set forth in any of [1] to [4], wherein the resin (A) is a polymer having at least one structural unit selected from the group of the structural units represented by the following formulas (3) to (6).

[Chemical formula 3]

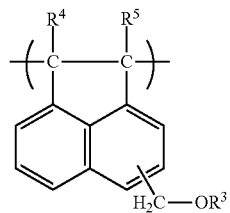

(3)

[$R^3$ is a hydrogen atom or a monovalent organic group; and $R^4$ and $R^5$ are each independently a monovalent atom or a monovalent organic group.]

[Chemical formula 4]

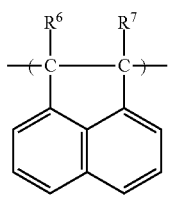

(4)

[$R^6$ and $R^7$ are each independently a monovalent atom or a monovalent organic group.]

[Chemical formula 5]

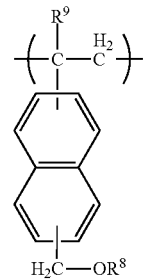

(5)

[$R^8$ is a hydrogen atom or a monovalent organic group, and $R^9$ is a monovalent atom or a monovalent organic group.]

[Chemical formula 6]

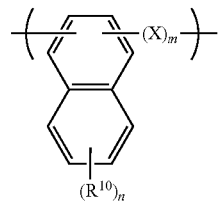

(6)

[In the formula, $R^{10}$s are a hydroxyl group, an alkyl group which may have a substituent of 1 to 6 carbon atoms, an alkoxy group which may have a substituent of 1 to 6 carbon atoms, an alkoxycarbonyl group which may have a substituent of 2 to 10 carbon atoms, an aryl group which may have a substituent of 6 to 14 carbon atoms, or a glycidyl ether group which may have a substituent of 2 to 6 carbon atoms; n is an integer of 0 to 6; when n is 2 to 6, a plurality of $R^{10}$s may be the same or different from each other; X is a methylene group, an alkylene group which may have a substituent of 2 to 20 carbon atoms, an arylene group which may have a substituent of 6 to 14 carbon atoms, or an alkylene ether group; m is an integer of 1 to 8; when m is 2 to 8, a plurality of Xs may be the same or different from each other; and n+m is an integer of 1 to 8.]

The composition for formation of resist lower layer film, of the present invention has a filling property to the gaps of substrate, gives a lower layer film having etching resistance, and can effectively prevent the staining of the film formation apparatus used.

EXPLANATION OF NUMERICAL SYMBOLS

Figure 1:
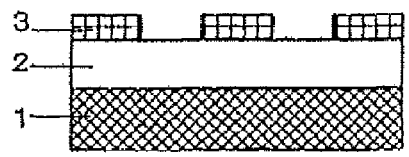
FIG. 1 is a schematic drawing which explains one step of the method for forming a dual damascene structure using the composition for forming a resist lower layer film, of the present invention.

1: substrate; 2: first low dielectric insulating film; 3, 13: resist lower layer film; 4: wiring groove (trench); 5, 15: barrier metal; 6: lower copper wiring layer; 7: second low dielectric insulating film; 8: first etching stopper layer; 9: third low dielectric insulating film; 10: second etching stopper layer; 11: resist lower layer film; 12: via hole; 14: trench; 16: via wiring; 17: upper copper wiring layer.

BEST MODE FOR CARRYING OUT THE INVENTION

The embodiment of the present invention is described below. However, the present invention is in no way restricted to the following embodiment. That is, it should be construed that appropriate modifications, improvements, etc. can be added to the following embodiment based on the ordinary knowledge possessed by those skilled in the art, as long as there is no deviation from the gist of the present invention and that the resulting embodiments as well belong to the scope of the present invention.

[1] Composition for Formation of Resist Lower Layer Film

The composition for formation of resist lower layer film, of the present invention contains (A) a resin, (B) a butyl ether group-containing crosslinking agent and (C) a solvent.

[1-A] Resin

The composition for formation of resist lower layer film, of the present invention contains a resin [hereinafter, this resin may be referred to as "resin (A)"]. In the composition of the present invention, the resin (A) is preferably a resin having a glass transition temperature of 130° C. or higher for sufficient etching resistance, more preferably a polymer having a naphthalene skeleton, in particular, an acenaphthylene skeleton, particularly preferably a polymer having at least one structural unit selected from the group of the structural units represented by the following formulas (3) to (6).

[Chemical formula 7]

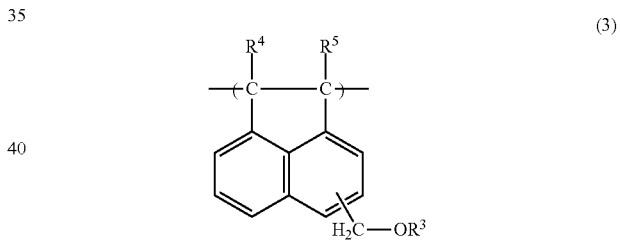

(3)

[Chemical formula 8]

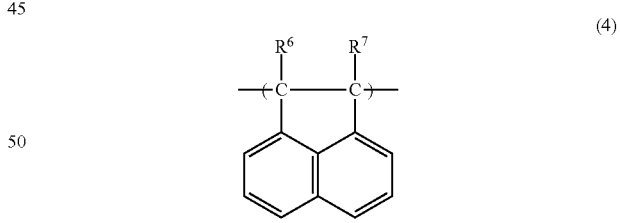

(4)

[Chemical formula 9]

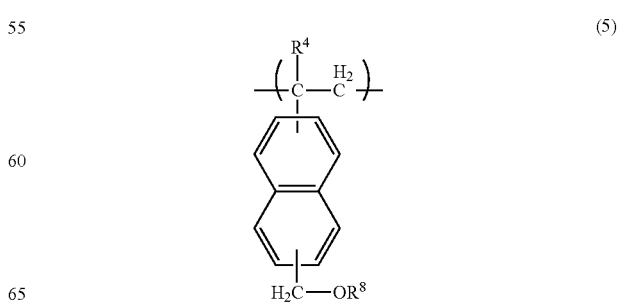

(5)

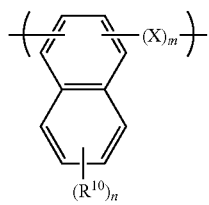

$$\left(\underset{(R^{10})_n}{\overbrace{\phantom{XXXXX}}}(X)_m\right) \quad (6)$$

In the structural unit represented by the formula (3), i.e. the structural unit (3), the monovalent organic group represented by $R^3$ is preferably a group of 1 to 10 carbon atoms. Specifically, there can be mentioned phenyl group, alkyl group, alkenyl group, acyl group, and functional group obtained by substituting a moiety of each of the above groups with a functional group such as halogen atom, hydroxyl group, mercapto group, carboxyl group, nitro group, sulfonic acid group or the like. The functional group obtained by the substitution may be one substituted with two or more kinds of functional groups.

The alkyl group is preferably a straight chain or branched chain alkyl group of 1 to 6 carbon atoms. Specifically, there can be mentioned methyl group, ethyl group, n-propyl group, i-propyl group, n-butyl group, i-butyl group, sec-butyl group, t-butyl group, etc. The alkenyl group is preferably a straight chain or branched chain alkenyl group of 2 to 6 carbon atoms. Specifically, there can be mentioned vinyl group, allyl group, methallyl group, 1-butenyl group, 2-butenyl group, etc. The acyl group is preferably an aliphatic or aromatic acyl group of 2 to 6 carbon atoms. Specifically, there can be mentioned acetyl group, propionyl group, butyryl group, benzoyl group, etc.

In the structural unit (3), as the monovalent atom represented by $R^4$ or $R^5$, there can be mentioned, for example, hydrogen atom and halogen atom such as fluorine atom, chlorine atom, bromine atom or the like. As the monovalent organic group represented by $R^4$ or $R^5$, there can be mentioned groups mentioned as the monovalent organic group represented by $R^3$.

In the structural unit (3), the group represented by $R^3$ is preferably hydrogen atom, methyl group or acetyl group. The group represented by $R^4$ or $R^5$ is preferably hydrogen atom, methyl group or phenyl group.

The polymer having the structural unit (3) can be obtained, for example, by subjecting an acenaphthylene corresponding to the structural unit (3), to radical polymerization, anionic polymerization, cationic polymerization or the like, alone or, depending upon the intended purpose, together with other copolymerizing unsaturated compound. The polymerization can be conducted in a known polymerization mode such as bulk polymerization, solution polymerization or the like.

Incidentally, a polymer having a structural unit (3) in which $R^3$ is a hydrogen atom, can also be produced by subjecting the acetoxy group of a polymer having a structural unit (3) in which $R^3$ is an acetyl group, to hydrolysis by an ordinary method. Further, a polymer having a structural unit (3) in which $R^3$ is an acetyl group, can also be produced by subjecting the hydroxyl group of a polymer having a structural unit (3) in which $R^3$ is a hydrogen atom, to acetylation by an ordinary method.

As the acenaphthylene corresponding to the structural unit (3), there can be mentioned, for example, hydroxymethylacenaphthylenes such as 3-hydroxymethylacenaphthylene, 4-hydroxymethylacenaphthylene, 5-hydroxymethylacenaphthylene, 1-methyl-3-hydroxymethylacenaphthylene, 1-methyl-4-hydroxymethylacenaphthylene, 1-methyl-5-hydroxymethylacenaphthylene, 1-methyl-6-hydroxymethylacenaphthylene, 1-methyl-7-hydroxymethylacenaphthylene, 1-methyl-8-hydroxymethylacenaphthylene, 1,2-dimethyl-3-hydroxymethylacenaphthylene, 1,2-dimethyl-4-hydroxymethylacenaphthylene, 1,2-dimethyl-5-hydroxymethylacenaphthylene, 1-phenyl-3-hydroxymethylacenaphthylene, 1-phenyl-4-hydroxymethylacenaphthylene, 1-phenyl-5-hydroxymethylacenaphthylene, 1-phenyl-6-hydroxymethylacenaphthylene, 1-phenyl-7-hydroxymethylacenaphthylene, 1-phenyl-8-hydroxymethylacenaphthylene, 1,2-diphenyl-3-hydroxymethylacenaphthylene, 1,2-diphenyl-4-hydroxymethylacenaphthylene, 1,2-diphenyl-5-hydroxymethylacenaphthylene and the like; acetoxymethylacenaphthylenes such as 3-acetoxymethylacenaphthylene, 4-acetoxymethylacenaphthylene, 5-acetoxymethylacenaphthylene, 1-methyl-3-acetoxymethylacenaphthylene, 1-methyl-4-acetoxymethylacenaphthylene, 1-methyl-5-acetoxymethylacenaphthylene, 1-methyl-6-acetoxymethylacenaphthylene, 1-methyl-7-acetoxymethylacenaphthylene, 1-methyl-8-acetoxymethylacenaphthylene, 1,2-dimethyl-3-acetoxymethylacenaphthylene, 1,2-dimethyl-4-acetoxymethylacenaphthylene, 1,2-dimethyl-5-acetoxymethylacenaphthylene, 1-phenyl-3-acetoxymethylacenaphthylene, 1-phenyl-4-acetoxymethylacenaphthylene, 1-phenyl-5-acetoxymethylacenaphthylene, 1-phenyl-6-acetoxymethylacenaphthylene, 1-phenyl-7-acetoxymethylacenaphthylene, 1-phenyl-8-acetoxymethylacenaphthylene, 1,2-diphenyl-3-acetoxymethylacenaphthylene, 1,2-diphenyl-4-acetoxymethylacenaphthylene, 1,2-diphenyl-5-acetoxymethylacenaphthylene and the like; methoxymethylacenaphthylenes such as 3-methoxymethylacenaphthylene, 4-methoxymethylacenaphthylene, 5-methoxymethylacenaphthylene, 1-methyl-3-methoxymethylacenaphthylene, 1-methyl-4-methoxymethylacenaphthylene, 1-methyl-5-methoxymethylacenaphthylene, 1-methyl-6-methoxymethylacenaphthylene, 1-methyl-7-methoxymethylacenaphthylene, 1-methyl-8-methoxymethylacenaphthylene, 1,2-dimethyl-3-methoxymethylacenaphthylene, 1,2-dimethyl-4-methoxymethylacenaphthylene, 1,2-dimethyl-5-methoxymethylacenaphthylene, 1-phenyl-3-methoxymethylacenaphthylene, 1-phenyl-4-methoxymethylacenaphthylene, 1-phenyl-5-methoxymethylacenaphthylene, 1-phenyl-6-methoxymethylacenaphthylene, 1-phenyl-7-methoxymethylacenaphthylene, 1-phenyl-8-methoxymethylacenaphthylene, 1,2-diphenyl-3-methoxymethylacenaphthylene, 1,2-diphenyl-4-methoxymethylacenaphthylene, 1,2-diphenyl-5-methoxymethylacenaphthylene and the like; and 3-phenoxymethylacenaphthylene, 4-phenoxymethylacenaphthylene, 5-phenoxymethylacenaphtyelne, 3-vinyloxymethylacenaphthylene, 4-vinyloxymethylacenaphthylene, and 5-vinyloxymethylacenaphthylene.

Of these acenaphthylenes, particularly preferred are 3-hydroxymethylacenaphthylene, 4-hydroxymethylacenaphthylene, 5-hydroxymethylacenaphthylene, 3-acetoxymethylacenaphthylene, 4-acetoxymethylacenaphthylene, 5-acetoxymethylacenaphthylene, 3-methoxymethylacenaphthylene, 4-methoxymethylacenaphthylene, 5-methoxymethylacenaphthylene, etc. The above-mentioned acenaphthylenes may be used singly or in admixture of two or more kinds.

The polymer having the structural unit (3) has property of forming a crosslinkage between the molecular chains when heated or exposed to a light. The polymer is useful for use in the composition for formation of resist lower layer film, such as of the present invention and also can be used as a coating, an adhesive, an insulating material, etc., by itself or by mixing with other curing resin or a curing rubber.

In the structural unit represented by the formula (4), i.e. the structural unit (4), as the monovalent atom or monovalent organic group represented by $R^6$ or $R^7$, there can be mentioned groups mentioned as the monovalent atom or monovalent organic group represented by $R^4$ or $R^5$ in the structural unit (3). In the structural unit (4), $R^6$ or $R^7$ is preferably a hydrogen atom or a methyl group.

In the structural unit represented by the formula (5), i.e. the structural unit (5), as the monovalent organic group represented by $R^8$, there can be mentioned, for example, the same groups as mentioned for the monovalent organic group of $R^3$ in the structural unit (3). Also, as the monovalent atom and monovalent organic group represented by $R^9$, there can be mentioned, for example, the same groups as mentioned for the monovalent atom and monovalent organic group of $R^4$ or $R^5$ in the structural unit (3).

In the structural unit (5), $R^8$ is particularly preferably a hydrogen atom, a methyl group or the like. Also, $R^9$ is particularly preferably a hydrogen atom, a methyl group or the like.

The polymer having the structural unit (5) can be obtained, for example, by subjecting an aromatic vinyl type compound corresponding to the structural unit (5), to radical polymerization, anionic polymerization, cationic polymerization or the like, alone or, depending upon the intended purpose, together with other copolymerizing unsaturated compound. The polymerization can be conducted in a known polymerization mode such as bulk polymerization, solution polymerization or the like.

Incidentally, a polymer having a structural unit (5) in which $R^8$ is a hydrogen atom, can also be produced by subjecting the acetoxy group of a polymer having a structural unit (5) in which $R^8$ is an acetyl group, to hydrolysis by an ordinary method. Further, a polymer having a structural unit (5) in which $R^8$ is an acetyl group, can also be produced by subjecting the hydroxyl group of a polymer having a structural unit (5) in which $R^8$ is a hydrogen atom, to acetylation by an ordinary method.

As the aromatic vinyl type compound corresponding to the structural unit (5), there can be mentioned, for example, hydroxymethylstyrene type compounds such as 2-hydroxymethylstyrene, 3-hydroxymethylstyrene, 4-hydroxymethylstyrene, 2-hydroxymethyl-α-methylstyrene, 3-hydroxymethyl-α-methylstyrene, 4-hydroxymethyl-α-methylstyrene and the like; methoxymethylstyrene type compounds such as 2-methoxymethylstyrene, 3-methoxymethylstyrene, 4-methoxymethylstyrene, 2-methoxymethyl-α-methylstyrene, 3-methoxymethyl-α-methylstyrene, 4-methoxymethyl-α-methylstyrene and the like; other styrene type compounds such as 4-phenoxymethylstyrene, 4-phenoxymethyl-α-methylstyrene, 4-vinyloxymethylstyrene, 4-vinyloxymethyl-α-methylstyrene, 4-acetoxymethylstyrene, 4-acetoxymethyl-α-methylstyrene and the like; hydroxymethyl-1-vinylnaphthalene type compounds such as 4-hydroxymethyl-1-vinylnaphthalane, 7-hydroxymethyl-1-vinylnaphthalane, 8-hydroxymethyl-1-vinylnaphthalane, 4-hydroxymethyl-1-isopropenylnaphthalene, 7-hydroxymethyl-1-isopropenylnaphthalene, 8-hydroxymethyl-1-isopropenylnaphthalene and the like; methoxymethyl-1-vinylnaphthalene type compounds such as 4-methoxymethyl-1-vinylnaphthalene, 7-methoxymethyl-1-vinylnaphthalene, 8-methoxymethyl-1-vinylnaphthalene, 4-methoxymethyl-1-isopropenylnaphthalene, 7-methoxymethyl-1-isopropenylnaphthalene, 8-methoxymethyl-1-isopropenylnaphthalene and the like; and other vinylnaphthalene type compounds such as 4-phenoxymethyl-1-vinylnaphthalene, 4-vinyloxymethyl-1-vinylnaphthalene, 4-acetoxymethyl-1-vinylnaphthalene, 4-phenoxymethyl-1-isopropenylnaphthalene, 4-vinyloxymethyl-1-isopropenylnaphthalene, 4-acetoxymethyl-1-isopropenylnaphthalene and the like.

Of these aromatic vinyl type compounds, particularly preferred are 4-hydroxymethylstyrene and 4-methoxymethylstyrene. The above-mentioned aromatic vinyl type compounds can be used singly or in admixture of two or more kinds.

As the other copolymerizing unsaturated compound used in obtaining the polymer having the structural unit (3), (4) or (5), there can be mentioned, for example, other aromatic vinyl type compounds such as styrene, α-methylstyrene, 2-methylstyrene, 3-methylstyrene, 4-methylstyrene, 1-vinylnaphthalene, 2-vinylnaphthalene, 9-vinylanthracene, 9-vinylcarbazole and the like; vinyl ester type compounds such as vinyl acetate, vinyl propionate, vinyl caproate and the like; vinyl cyanide type compounds such as (meth)acrylonitrile, α-chloroacrylonitrile, vinylidene cyanide and the like; unsaturated carboxylic acid ester type compounds such as methyl(meth)acrylate, ethyl(meth)acrylate, n-propyl(meth)acrylate, i-propyl(meth)acrylate, n-butyl (meth)acrylate, t-butyl(meth)acrylate, n-hexyl (meth)acrylate, glycidyl(meth)acrylate and the like;

unsaturated group-containing unsaturated carboxylic acid ester type compounds such as ethylene glycol di(meth)acrylate, propylene glycol di(meth)acrylate, vinyl(meth)acrylate, dimethyl.vinyl.(meth)acryloyloxymethylsilane and the like; halogen-containing vinyl type compounds such as 2-chloroethylvinyl ether, vinyl chloroacetate, allyl chloroacetate and the like; hydroxyl group-containing vinyl type compounds such as 2-hydroxyethyl(meth)acrylate, 2-hydroxypropyl (meth)acrylate, (meth)allyl alcohol and the like; amide group-containing vinyl type compounds such as (meth)acrylamide, crotonic acid amide and the like; and carboxyl group-containing vinyl type compounds such as mono[2-(meth)acryloyloxyethyl]succinate, mono[2-(meth)acryloyloxyethyl]maleate, mono[2-(meth)acryloyloxyethyl]phthalate and the like. The above-mentioned other copolymerizing unsaturated compounds can be used singly or in admixture of two or more kinds.

In the structural unit represented by the formula (6), i.e. the structural unit (6), as the alkyl group of the substituent $R^{10}$, which may have a substituent of 1 to 6 carbon atoms, there can be mentioned methyl group, ethyl group, n-propyl group, i-propyl group, n-butyl group, 1-methylpropyl group, 2-methylpropyl group, tert-butyl group, n-pentyl group, n-hexyl group, etc. Of these, preferred is methyl group or ethyl group.

As the alkoxy group which may have a substituent of 1 to 6 carbon atoms, there can be mentioned methoxy group, ethoxy group, n-propoxy group, i-propoxy group, n-butoxy group, 1-methylpropoxy group, 2-methylpropoxy group, tert-butoxy group, n-pentyloxy group, n-hexyloxy group, etc. Of these, preferred is methoxy group or tert-butoxy group.

As the alkoxycarbonyl group which may have a substituent of 2 to 10 carbon atoms, there can be mentioned methoxycarbonyl group, ethoxycarbonyl group, n-propoxycarbonyl group, i-propoxycarbonyl group, n-butoxycarbonyl group, 1-methylpropoxycarbonyl group, 2-methylpropoxycarbonyl group, tert-butoxycarbonyl group, n-pentyloxycarbonyl group, n-hexyloxycarbonyl group, etc. Of these, preferred is methoxycarbonyl group, ethoxycarbonyl group or tert-butoxycarbonyl group.

As the aryl group which may have a substituent of 6 to 14 carbon atoms, there can be mentioned phenyl group, naphthyl group, anthracenyl group, pyrenyl group, etc. Of these, preferred is phenyl group or naphthyl group.

As the alkylene group which may have a substituent of 1 to 20 carbon atoms, represented by X, there can be mentioned methylene group, ethylene group, methylmethylene group, 2-furfurylmethylene group, phenylmethylene group, naphthylmethylene group, anthracenylmethylene group, pyrenylmethylene group, etc. Of these, preferred is methylene group, methylmethylene group or and 2-furfurylmethylene group.

As the arylene group which may have a substituent of 6 to 14 carbon atoms, there can be mentioned phenylene group, naphthylene group, biphenylene group, xylylene group, etc. Of these, preferred is phenylene group or naphthylene group.

The alkylene group is preferably an alkylene group which has 1 to 20 carbon atoms and can be substituted, and there can be mentioned, for example, methylene group and ethylene group.

The arylene group is preferably an arylene group which has 6 to 14 carbon atoms and can be substituted, and there can be mentioned, for example, phenylene group and naphthalene group.

The polymer having the structural unit (6) can be synthesized, for example, by the synthesis method (i) or the synthesis method (ii) both described below. The synthesis method (i) is a method of subjecting a naphthalene derivative corresponding to the structural unit (6) and an aldehyde to homo-condendation or to co-condensation together with other co-condensing component, in the presence of an acid catalyst. Meanwhile, the synthesis method (ii) is a method of subjecting a naphthalene derivative corresponding to the structural unit (6) and a divinyl compound to homo-condensation or to co-condensation together with other co-condensing component, in the presence of an acid catalyst.

As the aldehyde, there can be mentioned, for example, saturated aliphatic aldehydes such as formaldehyde, paraformaldehyde, acetaldehyde, propyl aldehyde and the like; unsaturated aliphatic aldehydes such as acrolein, methacrolein and the like; heterocyclic aldehydes such as furfural and the like; and aromatic aldehydes such as benzaldehyde, naphthylaldehyde, anthraldehyde and the like. Of these, particularly preferred is formaldehyde, paraformaldehyde or furfural. They may be used singly or in admixture of two or more kinds.

As the divinyl compound, there can be mentioned, for example, divinylbenzene, dicyclopentadiene, tetrahydroindene, 4-vinylcyclohexene, 5-vinylnorborna-2-ene, α-pinene, β-pinene, limonene, 5-vinylnorbornadiene, etc. Of these, particularly preferred is divinylbenzene. They may be used singly or in admixture of two or more kinds.

In these condensation reactions, there may be used, as the other co-condensing component, an aromatic hydrocarbon (hereinafter, this may be referred to as "aromatic compound"). In this case, this aromatic compound is used as a reaction component together with the naphthalene derivative. In this case, the condensation reaction is conducted by mixing the naphthalene derivative, the aromatic compound and the aldehyde and heating them in the presence of an acid catalyst in a solvent-less state or in a solvent.

As the aromatic compound, there can be used any aromatic compound as long as it can be co-condensed and polymerized with the naphthalene derivative. There can be mentioned, for example, unsubstituted aromatic hydrocarbons such as benzene, naphthalene, anthracene, phenanthrene, acenaphthene and the like; alkyl-substituted aromatic hydrocarbons such as toluene, m-xylene, p-xylene, 1-methylnaphthalene, 1,5-dimethylnaphthalene and the like; hydroxy-substituted aromatic hydrocarbons such as phenol, cresol, 1-naphthol, bisphenol, polyphenol and the like; carboxyl-substituted aromatic hydrocarbons such as benzoic acid, 1-naphthalenecarboxylic acid, 9-anthracenecarboxylic acid and the like; amino-substituted aromatic hydrocarbons such as aniline and the like; and halogenated aromatic hydrocarbons such as chlorobenzene, bromobenzene and the like. They can be used singly or in admixture of two or more kinds.

In the resin (A), the content of the structural unit (3) is preferably 5 to 80 mol %, more preferably 10 to 60 mol %, particularly preferably 30 to 60 mol % relative to the total structural units. The content of the structural unit (4) is preferably 5 to 95 mol %, more preferably 10 to 90 mol %, particularly preferably 20 to 90 mol % relative to the total structural units. The content of the structural unit (5) is preferably 5 to 80 mol %, more preferably 5 to 60 mol %, particularly preferably 5 to 40 mol % relative to the total structural units. The content of the structural unit (6) is preferably 5 to 100 mol %, more preferably 10 to 90 mol %, particularly preferably 30 to 80 mol % relative to the total structural units. The content of the structural unit derived from the other copolymerizing unsaturated compound or the other co-condensing component is preferably 50 mol % or less, more preferably 30 mol % or less relative to the total structural units.

The polystyrene-reduced mass-average molecular weight (hereinafter, this may be referred to "Mw") of the resin (A) as measured by gel permeation chromatography may be determined appropriately depending upon the properties required for the composition; however, it is preferably 500 to 5,000, more preferably 800 to 3,000. A mass-average molecular weight of 500 or more can give a composition for formation or resist lower layer film, of good coatability. Also, a mass-average molecular weight of 5,000 or less can give a composition of improved filling property.

The content of the resin (A) in the composition for formation of resist lower layer film differs depending upon the thickness of the resist lower layer film to be formed; however, it is ordinarily 5 to 30 mass %, preferably 8 to 15 mass %. A resin content of 5 mass % or more can give a resist lower layer film of sufficient thickness. Also, a resin content of 30 mass % or less can achieve a lower viscosity and improve the filling property to the gaps of substrate.

[1-B] Butyl Ether Group-Containing Crosslinking Agent (Crosslinking Agent)

In compositions for formation of resist lower layer film, a crosslinking agent is generally used for prevention of halation. However, the crosslinking agents hitherto used have had an inconvenience that they sublimate easily and, in formation of resist lower layer film, stain the film formation apparatus used. Further, even when there is used a crosslinking agent which sublimates hardly, there has been a case that the decomposition product of the crosslinking agent stains the film formation apparatus used.

Hence, in the composition for formation of resist lower layer film, of the present invention, there is used a butyl ether group-containing crosslinking agent (hereinafter, this agent may be referred to as "crosslinking agent (B)"). The butyl ether group-containing crosslinking agent is low in sublimating property and the decomposition products thereof such as 1-butene, 2-butene, isobutene and the like are gaseous substances under standard conditions. Therefore, with the crosslinking agent (B), the disadvantage of staining of film formation apparatus can be prevented effectively in the formation of resist lower layer film.

As the "butyl ether group", there can be mentioned, for example, n-butyl ether group, isobutyl ether group and t-butyl ether group. Of these, preferred is n-butyl ether group.

As the butyl ether group-containing crosslinking agent, there can be mentioned, for example, a butyl ether group-modified polynuclear phenol and a butyl ether group-modified amino resin.

As the butyl ether group-modified polynuclear phenol, there can be mentioned, for example, those obtained by introducing butyl ether group into a polyphenol such as dinuclear phenol (e.g. 4,4'-biphenyldiol, 4,4'methylenebisphenol, 4,4'-ethylidenebisphenol or bisphenol A), trinuclear phenol (e.g. 4,4',4''-methylidenetrisphenol or 4,4'-[1-{4-(1-[4-hydroxyphenyl]-1-methylethyl)phenyl}ethylidene]bisphenol), novolac or the like.

As the butyl ether group-modified amino resin, there can be mentioned, for example, those obtained by treating an amino resin (which is a co-condensation product between urea, thiourea, ethylene urea, melamine benzoguanamine or the like and formaldehyde) with n-butyl alcohol or isobutyl alcohol and introducing butyl ether group into the treated product.

In the composition for formation of resist lower layer film, of the present invention, there is preferably used, as the crosslinking agent, a nitrogen-containing cyclic compound having at least two butyl ether groups. The "nitrogen-containing cyclic compound" is sufficient if it is a heterocyclic compound having nitrogen atom in the cyclic structure, and there is no particular restriction as to the cyclic structure. The cyclic structure may be, for example, a 5-membered ring, a 6-membered ring, a higher-membered ring, a condensed ring thereof. Of these, preferred is a condensed ring in which two 5-membered rings are condensed, or a 6-membered ring.

There is no particular restriction, either, as to the number of the nitrogen atoms contained in the ring structure. There is preferred a ring structure containing 2 to 3 nitrogen atoms in each ring. There is preferred a ring structure containing 3 to 4 nitrogen atoms in the total rings. Incidentally, the compound as a whole preferably contains 4 to 6 nitrogen atoms.

In consideration of all the above conditions, the nitrogen-containing cyclic compound is preferably a compound having a glycoluril skeleton. As a compound having at least two butyl ether groups and a glycoluril skeleton, there can be mentioned a compound represented by the following formula (1). That is, in the composition for formation of resist lower layer film, of the present invention, it is preferred to use, as the crosslinking agent, a compound represented by the following formula (1). In this compound, an alkoxymethyl group is introduced into the four nitrogen atoms of glycoluril and at least two of these alkoxymethyl groups are each a butoxymethyl group.

[Chemical formula 11]

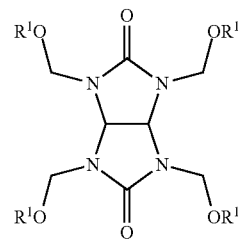

(1)

[$R^1$s are each independently a hydrogen atom, a methyl group, an ethyl group, a propyl group or a butyl group, with a proviso that at least two $R^1$s are each a butyl group.]

Also preferably, the nitrogen-containing cyclic compound is a compound having a triazine skeleton. The triazine skeleton is preferably a 1,3,5-triazine skeleton, more preferably a melamine skeleton. As the compound having at least two butyl ether groups and further having a triazine skeleton, there can be mentioned a compound represented by the following formula (2). That is, the crosslinking agent used in the composition for formation of resist lower layer film, of the present invention is preferably a compound represented by the following formula (2). In this compound, the six hydroxyl groups of hexamethylolmelamine are each alkyl-etherified and at least two of the alkyl ether groups are each a butyl ether group.

[Chemical formula 12]

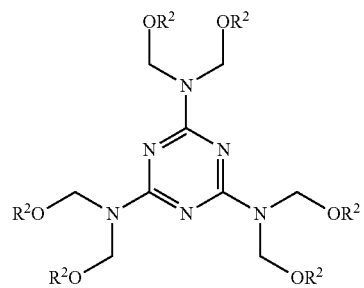

(2)

[$R^2$s are each independently a hydrogen atom, a methyl group, an ethyl group, a propyl group or a butyl group, with a proviso that at least two $R^2$s are each a butyl group.]

In the compound represented by the formula (1) or (2), at least two $R^1$s or two $R^2$s are each a butyl group; therefore, the crosslinking agent is low in sublimating property and the staining of film formation apparatus by the sublimation product of the composition for formation of resist lower layer film can be prevented.

In the compound represented by the formula (1) or (2), as the number of butyl groups is larger, the sublimation of the crosslinking agent can be suppressed more strongly. The compound represented by the formula (1) or (2) is preferably a compound wherein all of the $R^1$s or $R^2$s are n-butyl groups.

The content of the crosslinking agent (B) in the composition for formation of resist lower layer film differs depending upon the kind of the polymer contained in the composition. However, the content is ordinarily 1 to 50 parts by mass, preferably 5 to 30 parts by mass relative to 100 parts by mass of the resin. By using the crosslinking agent in a content of 1 part by mass or more, a higher crosslinking ability is obtained and the halation of resist lower layer film can be prevented effectively. By using the crosslinking agent in a content of 50 parts by mass, there can be effectively prevented the reduction in etching resistance, caused by the remaining of the unreacted crosslinking agent (the free crosslinking agent not reacted with the resin) in the resist lower layer film.

[1-C] Solvent

As to the solvent used in the composition for formation of resist lower layer film, of the present invention, there is no particular restriction as long as it can dissolve the resin (A), the crosslinking agent (B) and additives described later. There can be appropriately selected and used, for example, ethylene glycol monoalkyl ethers such as ethylene glycol monomethyl ether, ethylene glycol monoethyl ether, ethylene glycol mono-n-propyl ether, ethylene glycol mono-n-butyl ether and the like; ethylene glycol monoalkyl ether acetates such as ethylene glycol monomethyl ether acetate, ethylene glycol monoethyl ether acetate, ethylene glycol mono-n-propyl ether acetate, ethylene glycol mono-n-butyl ether acetate and the like; diethylene glycol dialkyl ethers such as diethylene glycol dimethyl ether, diethylene glycol diethyl ether, diethylene glycol di-n-propyl ether, diethylene glycol di-n-butyl ether and the like; triethylene glycol dialkyl ethers such as triethylene glycol dimethyl ether, triethylene glycol diethyl ether and the like;
propylene glycol monoalkyl ethers such as propylene glycol monomethyl ether, propylene glycol monoethyl ether, propylene glycol mono-n-propyl ether, propylene glycol mono-n-butyl ether and the like; propylene glycol dialkyl ethers such as propylene glycol dimethyl ether, propylene glycol diethyl ether, propylene glycol di-n-propyl ether, propylene glycol di-n-butyl ether and the like; propylene glycol monoalkyl ether acetates such as propylene glycol monomethyl ether acetate, propylene glycol monoethyl ether acetate, propylene glycol mono-n-propyl ether acetate, propylene glycol mono-n-butyl ether acetate and the like;
lactic acid esters such as methyl lactate, ethyl lactate, n-propyl lactate, i-propyl lactate, n-butyl lactate, i-butyl lactate and the like; aliphatic carboxylic acid esters such as methyl formate, ethyl formate, n-propyl formate, i-propyl formate, n-butyl formate, i-butyl formate, n-amyl formate, i-amyl formate, methyl acetate, ethyl acetate, n-propyl acetate, i-propyl acetate, n-butyl acetate, isobutyl acetate, n-amyl acetate, i-amyl acetate, n-hexyl acetate, methyl propionate, ethyl propionate, n-propyl propionate, i-propyl propionate, n-butyl propionate, i-butyl propionate, methyl butyrate, ethyl butyrate,
n-propyl butyrate, i-propyl butyrate, n-butyl butyrate, i-butyl butyrate and the like;
other esters such as ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxypropyl acetate, 3-methoxybutyl acetate, 3-methyl-3-methoxybutyl acetate, 3-methyl-3-methoxybutyl propionate, 3-methyl-3-methoxybutyl butyrate, methyl acetoacetate, methyl pyruvate, ethyl pyruvate and the like; aromatic hydrocarbons such as toluene, xylene and the like; ketones such as methyl ethyl ketone, methyl n-propyl ketone, methyl n-butyl ketone, 2-heptanone, 3-heptanone, 4-heptanone, cyclohexanone and the like; amides such as N-methylformamide, N,N-dimethylformamide, N-methylacetamide, N,N-dimethylacetamide, N-methylpyrrolidone and the like; and lactones such as γ-butyrolactone and the like.

Of these solvents, preferred are ethylene glycol monoethyl ether acetate, ethyl lactate, n-butyl lactate, ethyl 3-ethoxypropionate, methyl 3-methoxypropionate, 2-heptanone, cyclohexanone, etc. The above-mentioned solvents can be used singly or in admixture of two or more kinds.

The use amount of the solvent is such an amount that the solid content of the composition obtained becomes ordinarily 0.01 to 70 mass %, preferably 0.05 to 60 mass %, more preferably 0.1 to 50 mass %.

[1-D] Other Additives

In the composition for formation of resist lower layer film, of the present invention, there may be used, as necessary, various additives such as acid-generating agent, binder, radiation-absorbing agent, surfactant, storage stabilizer, defoaming agent, adhesion aid and the like, as long as the effects of the present invention are not impaired.

As the acid-generating agent, there is used a substance which generates an acid when it undergoes chemical or physical stimulus. There can be mentioned, for example, a light acid-generating agent which generates an acid when exposed to a light, and a heat acid-generating agent which generates an acid when heated.

As the light acid-generating agent, there can be mentioned, for example, onium salt type light acid-generating agents such as diphenyliodonium trifluoromethanesulfonate, diphenyliodonium nonafluoro-n-butanesulfonate, diphenyliodonium pyrenesulfonate, diphenyliodonium n-dodecylbenzenesulfonate, diphenyliodonium 10-camphorsulfonate, diphenyliodonium naphthalenesulfonate, diphenyliodonium hexafluoroantimonate, bis(4-t-butylphenyl)iodonium trifluoromethanesulfonate, bis(4-t-butylphenyl)iodonium nonafluoro-n-butanesulfonate, bis(4-t-butylphenyl)iodonium n-dodecylbenzenesulfonate, bis(4-t-butylphenyl)iodonium 10-camphorsulfonate, bis(4-t-butylphenyl)iodonium naphthalenesulfonate, bis(4-t-butylphenyl)iodonium hexafluoroantimonate, triphenylsulfonium trifluoromethanesulfonate, triphenylsulfonium nonafluoro-n-butanesulfonate, triphenylsulfonium n-dodecylbenzenesulfonate, triphenylsulfonium naphthalenesulfonate, triphenylsulfonium 10-camphorsulfonate, triphenylsulfonium hexafluoroantimonate, 4-hydroxyphenyl.phenyl.methylsulfonium p-toluenesulfonate, 4-hydroxyphenyl.benzyl.methylsulfonium p-toluenesulfonate, cyclohexyl.methyl.2-oxocyclohexylsulfonium trifluoromethanesulfonate, 2-oxocyclohexyldichlorohexylsulfonium trifluoromethanesulfonate, 2-oxocyclohexyldimethylsulfonium trifluoromethanesulfonate, 1-naphthyldimethylsulfonium trifluoromethanesulfonate, 1-naphthyldiethylsulfonium trifluoromethanesulfonate, 4-cyano-1-naphthyldimethylsulfonium trifluoromethanesulfonate, 4-cyano-1-naphthyldiethylsulfonium trifluoromethanesulfonate, 4-nitro-1-naphthyldimethylsulfonium trifluoromethanesulfonate, 4-nitro-1-naphthyldiethylsulfonium trifluoromethanesulfonate, 4-methyl-1-naphthyldimethylsulfonium trifluoromethanesulfonate, 4-methyl-1-naphthyldiethylsulfonium trifluoromethanesulfonate, 4-hydroxyl-1-naphthyldimethylsulfonium trifluoromethanesulfonate, 4-hydroxy-1-naphthyldiethylsulfonium trifluoromethanesulfonate,
1-(4-hydroxynaphthalene-1-yl)tetrahydrothiophenium trifluoromethanesulfonate, 1-(4-methoxynaphthalene-1-yl)tetrahydrothiophenium trifluoromethanesulfonate, 1-(4-ethoxynaphthalene-1-yl)tetrahydrothiophenium trifluoromethanesulfonate, 1-(4-methoxymethoxynaphthalene-1-yl)tetrahydrothiophenium trifluoromethanesulfonate, 1-(4-ethoxymethoxynaphthalene-1-yl)tetrahydrothiophenium trifluoromethanesulfonate, 1-[4-(1-methoxyethoxy)naphthalene-1-yl]tetrahydrothiophenium trifluoromethanesulfonate, 1-[4-(2-methoxyethoxy)naphthalene-1-yl]tetrahydrothiophenium trifluoromethanesulfonate, 1-(4- methoxycarbonyloxynaphthalene-1-yl) tetrahydrothiophenium trifluoromethanesulfonate, 1-(4-etoxycarbonyloxynaphthalene-1-yl)tetrahydrothiophenium trifluoromethanesulfonate, 1-(4-n-propoxycarbonyloxynaphthalene-1-yl)tetrahydrothiophenium trifluoromethanesulfonate, 1-(4-isopropoxycarbonyloxynaphthalene-1-yl)tetrahydrothiophenium trifluoromethanesulfonate, 1-(4-n-butoxycarbonyloxynaphthalene-1-yl)tetrahydrothiophenium trifluoromethanesulfonate, 1-(4-t-butoxycarbonyloxynaphthalene-1-yl) tetrahydrothiophenium trifluoromethanesulfonate, 1-[4-(2-tetrahydrofuranyloxy)naphthalene-1-yl] tetrahydrothiophenium trifluoromethanesulfonate, 1-[4-(2-tetrahydropyranyloxy)naphthalene-1-yl] tetrahydrothiophenium trifluoromethanesulfonate, 1-(4-benzyloxy)tetrahydrothiophenium trifluoromethanesulfonate, 1-(naphthylacetomethyl)tetrahydrothiophenium trifluoromethanesulfonate and the like; halogen-containing compound type light acid-generating agents such as phenyl bis(trichloromethyl)-s-triazine, 4-mehtoxyphenyl bis(trichloromethyl)-s-triazine, 1-naphthyl bis(trichloromethyl)-s-triazine and the like; diazoketone compound type light acid-generating agents such as 1,2-naphthoquinonediazide-4-sulfonyl chloride, 1,2-naphthoquinonediazide-5-sulfonyl chloride, 1,2-naphthoquinonediazide-4-sulfonic acid ester or 1,2-naphtoquinonediazide-5-sulfonic acid ester of 2,3,4,4'-tetrahydroxybenzophenone, and the like; sulfone compound type light acid-generating agents such as 4-trisphenacylsulfone, mesitylphenacylsulfone, bis(phenylsulfonyl)methane and the like; and sulfonic acid compound type light acid-generating agents such as benzoin tosylate, tris(trifluoromethanesulfonate) of pyrogallol, nitrobenzyl-9,10-diethoxyanthracene-2-sulfonate, trifluoromethanesulfonylbicyclo[2,2,1]hepto-5-ene-2,3-dicarbodimide, N-hydroxysuccinimide trifluoromethanesulfonate, 1,8-naphthalenedicarboxylic acid imide trifluoromethanesulfonate, and the like.

Of these light acid-generating agents, preferred are diphenyliodonium trifluoromethanesulfonate, diphenyliodonium nonafluoro-n-butanesulfonate, diphenyliodonium pyrene sulfonate, diphenyliodonium n-dodecylbenzenesulfonate, diphenyliodonium 10-camphorsulfonate, diphenyliodonium naphthalenesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium n-dodecylbenzenesulfonate, bis(4-t-butylphenyl)iodonium 10-camphorsulfonate, and bis(4-t-butylphenyl)iodonium naphthalenesulfonate. These light acid-generating agents can be used singly or in admixture of two or more kinds.

As the acid-generating agent which generates an acid when heated (hereinafter, this agent is referred to as "heat acid-generating agent"), there can be mentioned, for example, 2,4,4,6-tetrabromocyclohexadienone, benzoin tosylate, 2-nitrobenzyl tosylate and alkyl sulfonates. These heat acid-generating agents may be used singly or in admixture of two or more kinds. It is possible to use, as the acid-generating agent, a combination of a light acid-generating agent and a heat acid-generating agent.

The acid-generating agent is used ordinarily by 5,000 parts by mass or less, preferably by 0.1 to 1,000 parts by mass, more preferably by 0.1 to 100 parts by mass relative to 100 parts by mass of the solid content of the composition for formation of resist lower layer film. The composition for formation of resist lower layer film, of the present invention contains the light acid-generating agent and/or the heat acid-generating agent; therefore, the composition can form crosslinkage effectively between the molecular chains of polymer molecules at relatively low temperatures including room temperature.

As the binder, various thermoplastic resins and thermosetting resins can be used. As the thermosetting resin, there can be mentioned, for example, α-olefin-based polymers such as polyethylene, polypropylene, poly-1-butene, poly-1-pentene, poly-1-hexene, poly-1-heptene, poly-1-octene, poly-1-decene, poly-1-dodecene, poly-1-tetradecene, poly-1-hexadecene, poly-1-octadecene, polycycloalkane and the like; non-conjugated diene-based polymers such as poly-1,4-heptadiene, poly-1,4-hexadiene, poly-1,5-hexadiene and the like; α,β-unsaturated aldehyde-based polymers; α,β-unsaturated ketone-based polymers such as poly(methyl vinyl ketone), poly(aromatic vinyl ketone), poly(cyclic vinyl ketone) and the like; polymers of α,β-unsaturated carboxylic acids or derivatives thereof, such as (meth)acrylic acid, α-chloroacrylic acid, (meth)acrylic acid salt, (meth)acrylic acid ester, (meth)acrylic acid halide and the like; polymers of α,β-unsaturated carboxylic acid anhydrides; polymers of unsaturated polybasic carboxylic acid esters such as methylenemalonic acid diester, itaconic acid diester and the like; polymers of diolefincarboxylic acid esters such as sorbic acid ester, muconic acid ester and the like; α,β-unsaturated carboxylic acid thio esters such as (meth)acrylic acid thio ester, α-chloroacrylic acid thio ester and the like; polymers of (meth)acrylonitrile or derivative thereof, such as (meth)acrylonitrile, α-chloroacrylonitrile and the like; polymers of (meth)acrylamide or derivative thereof, such as (meth)acrylamide, N,N-dimethyl(meth)acrylamide and the like; polymers of styryl metal compounds; polymers of vinyloxy metal compounds; polyimines; polyethers such as polyphenylene oxide, poly-1,3-dioxolane, polyoxirane, polytetrahydrofuran, polytetrahydropyrane and the like; polysulfides; polysulfonamides; polypeptides; polyamides such as nylon 66, nylon 1 to nylon 12, and the like; polyesters such as aliphatic polyester, aromatic polyester, alicyclic polyester, polycarbonic acid ester and the like; polyurea; polysulfone; polyazine; polyamine; polyaromatic ketone; polyimide; polybenzimidazole; polybenzoxazole; polybenzothiazole; polyaminotriazole; polyoxadiazole; polypyrazole; polytetrazole; polyquinoxaline; polytriazine; polybenzoxazinone; polyquinoline; and polyanthrazoline.

The thermosetting resin is a component which is cured and becomes insoluble in the solvent when heated and thereby can prevent the intermixing between the resist lower layer film formed and the resist film formed thereon, and can be used preferably as a binder. As such a thermosetting resin, there can be mentioned, for example, thermosetting acrylic resin, phenolic resin, urea resin, melamine resin, amino resin, aromatic hydrocarbon resin, epoxy resin and alkyd resin. Of these thermosetting resins, preferred are urea resin, melamine resin, aromatic hydrocarbon resin, etc.

The binder can be used as a single substance or as an admixture of two or more kinds. The use amount of the binder is ordinarily 20 parts by mass or less, preferably 10 parts by mass or less relative to 100 parts by mass of the resin (A).

As the radiation-absorbing agent, there can be mentioned, for example, dyes such as oil-soluble dye, disperse dye, basic dye, methine-based dye, pyrazole-based dye, imidazole-based dye, hydroxyazo type dye and the like; fluorescent brightening agents such as bicucine derivative, norbicucine, stilbene, 4,4'-diaminostilbene derivative, coumarin derivative, pyrazoline derivative and the like; ultraviolet absorbers such as hydroxyazo type dye, Tinuvin 234 (trade name, product of Ciba-Geigy), Tinuvin 1130 (trade name, product of Ciba-Geigy) and the like; and aromatic compounds such as anthracene derivative, anthraquinone derivative and the like. These radiation absorbers can be used singly or in admixture of two or more kinds. The use amount of the radiation absorber is ordinarily 100 parts by mass or less, preferably 50 parts by mass or less relative to 100 parts by mass of the solid content of the composition for formation of resist lower layer film.

The surfactant is a component which can improve coatability, striation, wettability, developing property, etc. As such a surfactant, there can be mentioned, for example, nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, polyethylene glycol distearate and the like; and commercial products having trade names such as KP 341 (product of Shin-Etsu Chemical Co., Ltd.), POLYFLOW No. 75 and No. 95 (products of Kyoeisha Chemical Co., Ltd.) F Top EF 101, EF 204, EF 303 and EF 352 (products of TOHKEM PRODUCTS CORPORATION), MEGAFAC F 171, F 172 and F 173 (products of Dainippon Ink and Chemicals, Incorporated), FLUORAD FC 430, FC 431, FC 135 and FC 93 (products of Sumitomo 3M Limited), and Asahi Guard AG 710, SURFLON S 382, SC 101, SC 102, SC 103, SC 104, SC 105 and SC 106 (products of Asahi Glass Co., Ltd.).

These surfactants can be used singly or in admixture of two or more kinds. The use amount of the surfactant is ordinarily 15 parts by mass or less, preferably 10 parts by mass or less relative to 100 parts by mass of the solid content of the composition for formation of resist lower layer film.

[2] Method for Production of Composition for Formation of Resist Lower Layer Film As to the method for production of the composition for formation of resist lower layer film, of the present invention, there is no particular restriction. The present composition for formation of resist lower layer film can be obtained, for example, by adding the above-mentioned solvent to the resin (A) and the crosslinking agent (B) so as to achieve an intended solid concentration and then filtering the resulting solution through a filter having a pore diameter of about 0.1 µm.

[3] Method for Formation of Dual Damascene Structure

A dual damascene structure can be formed by using the composition for formation of resist lower layer film, of the present invention. The method for formation of a dual damascene structure using the composition for formation of resist lower layer film, of the present invention is explained below.

The dual damascene structure can be formed by a method which comprises a step (a first transfer step) of using, as a mask, a photoresist film which has been formed on a resist lower layer film formed with the composition for formation of resist lower layer film, of the present invention and which has a resist pattern formed therein, and conducting etching to transfer the resist pattern of the photoresist film onto the resist lower layer film, a step (a second transfer step) of using, as a mask, the resist lower layer film which has the resist pattern of the photoresist film transferred thereonto, and transferring the resist pattern of the resist lower layer film onto a low dielectric insulating film provided beneath the resist lower layer film, and a step (a lower layer film removal step) of conducting plasma asking to remove the resist lower layer film, after transferring the resist pattern of the resist lower layer film onto a low dielectric insulating film.

The composition for formation of resist lower layer film, of the present invention can form a good resist pattern and has a good filling property to the gaps of substrate; therefore, the composition can form a dual damascene structure low in damage of inorganic film.

[3-1] First Transfer Step

First, by using, as a mask, a photoresist film which has been formed on a resist lower layer film formed with the above mentioned composition for formation of resist lower layer film and which has a resist pattern formed therein, etching is conducted to transfer the resist pattern of the photoresist film onto the resist lower layer film.

As to the photoresist film, there is no particular restriction as long as it has been formed on a resist lower layer film formed with the above mentioned composition for formation of resist lower layer film and which has a resist pattern formed therein. However, the photoresist film is preferably formed with a resist composition capable of forming a photoresist film. As such a resist composition, there can be mentioned, for example, a positive or negative, chemical amplification type resist composition containing a light acid-generating agent; a positive resist composition comprising an alkali-soluble resin and a quinone diazide type photosensitizer; and a negative resist composition comprising an alkali-soluble resin and a crosslinking agent. As to the method for forming the photoresist film on the resist lower layer film, there is no particular restriction, and the photoresist film can be formed by, for example, spin-coating.

Specifically, the photoresist film can be formed by spin-coating a resist composition on the resist lower layer film and then conducting prebaking to evaporate the solvent in the coated film. The temperature of the prebaking differs depending upon the kind of resist composition used, etc. but is preferably 30 to 200° C., more preferably 50 to 150° C.

The thickness of the photoresist film is preferably 100 to 20,000 nm, more preferably 100 to 200 nm.

In the composition for formation of resist lower layer film, of the present invention, the crosslinking agent, which is a substance responsible for staining of the film formation apparatus, used therein is low in sublimating property. Therefore, the present composition can form a resist lower layer film with no staining of film formation apparatus.

The photoresist film made with the resist composition is formed on the resist lower layer film by the above-mentioned spin-coating or the like and then is subjected to photolithography of resist process which comprises steps of application of radiation (exposure step), development, etc., whereby a resist pattern can be formed.

The exposure step of the resist process is a step of applying a radiation to the photoresist film via a mask (reticle) in which a device design has been drawn, to form a resist pattern corresponding to the device design. The radiation used in the exposure step can be appropriately selected from a visible light, an ultraviolet light, a far ultraviolet light, an X ray, an electron beam, a γ ray, a molecular beam, an ion beam, etc., depending upon the kind of the light acid-generating agent contained in the photoresist film. Preferred is a far ultraviolet light and particularly preferred are a KrF excimer laser (248 nm), an ArF excimer laser (193 nm), a F2 excimer laser (wavelength: 157 nm), a kr2 excimer laser (wavelength: 147 nm), an ArKr excimer laser (wavelength: 134 nm), an extreme ultraviolet light (wavelength: 13 nm), etc.

The developing solution used in the development of the resist process is selected appropriately depending upon the kind of the resist composition used. As the developing solution used for a positive chemical amplification type resist composition or a positive resist composition containing an alkali-soluble resin, there can be mentioned an alkaline aqueous solution containing, for example, sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo[5.4.0]-7-undecene, 1,5-diazabicyclo[4.3.0]-5-nonene or the like. The alkaline aqueous solution may contain appropriate amounts of a water-soluble organic solvent (e.g. a alcohol such as methanol or ethanol) and a surfactant.

As to the thickness of the resist lower layer film, there is no particular restriction; however, the thickness is preferably 100 to 2,000 nm, more preferably 200 to 1,000 nm, particularly preferably 200 to 500 nm. With a thickness of resist lower layer film, of 100 nm or more, a mask having a thickness sufficient for processing of substrate can be formed. Also, with a thickness of 2,000 nm or less, there can be avoided a disadvantage caused by too large a horizontal to vertical ratio (an aspect ratio) of patterned lower layer film and subsequent collapse of patterned lower layer film.

Then, using the photoresist film as a mask, the resist pattern of the photoresist is subjected to etching to transfer it onto the resist lower layer film. There is no particular restriction as to this etching; any of dry etching and wet etching may be used; and the etching can be conducted by a known method. For example, as the source gas used in dry etching, there can be used, for example, a gas molecule containing oxygen atom such as $O_2$, $CO$, $CO_2$ or the like; an inert gas such as He, $N_2$, Ar or the like; a chlorine-based gas such as $Cl_2$, $BCl_2$ or the like; $H_2$; and $NH_3$. A mixture of these gases may also be used.

[3-2] Second Transfer Step

Next, using, as a mask, the resist lower layer film obtained in the first transfer step, which has the resist pattern of the photoresist film transferred thereonto, the resist pattern of the resist lower layer film is transferred onto a low dielectric insulating film provided beneath the resist lower layer film.

The low dielectric insulating film (low-k film) is a film provided beneath the resist lower layer film. There can be mentioned, for example, an inorganic film, specifically an insulating film formed with silicon oxide, silicon nitride, silicon oxynitride, polysiloxane or the like. There can also be used a film formed with a commercial product such as "Black Diamond" (trade name, product of Applied Materials Japan Inc.), "Silk" (trade name, product of Dow Chemical Company), "LKD 5109" (trade name, product of JSR Corporation) or the like.

The low dielectric insulating film is a film formed so as to cover a substrate such as wafer. There is no particular restriction as to the method for formation thereof, and the film can be formed by a known method. It can be formed, for example, by a coating method (SOD: spin on dielectric) or a chemical vapor deposition method (CVD: chemical vapor deposition).

On the low dielectric insulating film formed as above is formed a resist lower layer film, by using the composition for formation of resist lower layer film, of the present invention. As to the method for forming the resist lower layer film, there is no particular restriction; however, there is mentioned, for example, a method of spin-coating the composition for formation of resist lower layer film, of the present invention on the low dielectric insulating film, to form a resist lower layer film.

Then, the resist pattern formed in the resist lower layer film is transferred onto the low dielectric insulating film. There is no particular restriction as to the method for transferring the resist pattern, and the transfer can be conducted by the above-mentioned etching.

The composition for formation of resist lower layer film, of the present invention has a good filling property; accordingly, when it is used in formation of a dual damascene structure, exposure of low dielectric insulating film to plasma during etching can be avoided. As a result, a dual damascene structure can be formed with no damage of low dielectric insulating film.

[3-3] Lower Layer Film Removal Step

After the resist pattern of the resist lower layer film has been transferred onto the low dielectric insulating film in the second transfer step, the resist lower layer film is removed by plasma ashing.

Plasma ashing is conducted in order to remove the mask remaining on the substrate after dry etching, such as resist lower layer film or photoresist film) and is an operation of generating a plasma of reaction gas (mainly an oxygen plasma or the like) and decomposing an organic substance (e.g. resist lower layer film or photoresist film) into COx, $H_2O$, etc. for removal.

As for the conditions of plasma ashing, for example, the high frequency electric power applied to susceptor is preferably 100 to 1,000 W, more preferably 100 to 500 W. Also, the susceptor temperature is preferably 20 to 100° C., more preferably 20 to 60° C. The pressure inside the treatment chamber is preferably 1 to 300 mtorr, more preferably 30 to 100 mtorr.

The gas used in the plasma ashing is preferably a gas containing at least one kind selected from the group consisting of nitrogen, hydrogen, ammonia and argon, which can suppress the rise in the relative dielectric constant of low dielectric insulating film, caused by ashing. When a mixed gas of nitrogen and hydrogen is used, hydrogen is preferably 0 to 20, more preferably 1 to 10 by volume ratio, relative to nitrogen 100. Also, when a mixed gas of ammonia and argon is used, argon is preferably 0 to 10 by volume ratio, relative to ammonia 100. By using a plasma of such a mixed gas, the resist lower layer film can be removed more efficiently. It is also preferred to use a mixed gas of ammonia, nitrogen and hydrogen.

[3-4] Other Steps

The photoresist film after light exposure is subjected to development and then is preferably washed and dried. Postbaking may be conducted after light exposure but before development, for improvement of resolution, pattern profile, developing property, etc.

An intermediate layer may be formed between the photoresist film and the resist lower layer film. The intermediate layer means a layer having a function which the resist lower layer film, the photoresist film or both of them do not have sufficiently in formation of resist pattern. For example, when the resist lower layer film is insufficient in anti-reflection function, there can be used, as an intermediate layer, a film having an anti-reflection function. As the material for intermediate layer, an organic compound or an inorganic oxide is selected appropriately depending upon the function required for the intermediate layer. For example, when the photoresist film is an organic compound, an inorganic oxide may be used for the intermediate layer.

The intermediate layer made of an organic compound can be formed by commercial products such as "DUV-42", "DUV-44", "ARC-28", "ARC-29" (trade names, products of Brewer Science Inc.), "AR-3", "AR-19" (trade names, products of Rohm and Haas Company) and the like. The intermediate layer made of an inorganic oxide can be formed by using polysiloxane, titanium oxide, aluminum oxide, tungsten oxide, etc. It may be formed also by using commercial products such as "NFC SOG 01", "NFC SOG 04" (trade names, products of JSR Corporation) and the like.

The intermediate layer can be formed by a coating method, a CVD method, etc. with the coating method being preferred. With the coating method, the intermediate layer can be formed continuously to the formation of the resist lower layer film but such continuous formation is impossible with the CVD method.

The thickness of the intermediate layer may be selected appropriately depending upon the function required for the intermediate layer. However, the thickness is preferably 10 to 3,000 nm, more preferably 20 to 300 nm. By employing an intermediate layer thickness of 10 nm or more, there can be avoided an disadvantage that the intermediate layer is scraped in the course of the etching of the resist lower layer film. Meanwhile, by employing an intermediate layer thickness of 3,000 nm or less, there can be effectively prevented the occurrence of transformational error in transferring the resist pattern of the photoresist film onto the intermediate layer.

Specific description is made below on one embodiment of the method for formation of dual damascene structure using the composition for formation of resist lower layer film, of the present invention.

FIG. 1 is a drawing showing a step of transferring, onto a resist lower layer film 3 formed on a low dielectric insulating film 2 formed on a substrate 1, the resist pattern of a photoresist film by dry etching.

The resist lower layer film formed with the composition for formation of resist lower layer film, of the present invention has good etching resistance; therefore, the resist pattern can be transferred satisfactorily onto the resist lower layer film 3.

Figure 2:
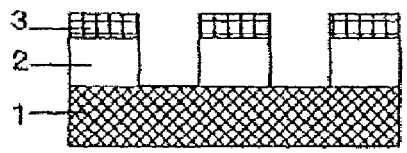
FIG. 2 is a schematic drawing which explains one step of the method for forming a dual damascene structure using the composition for forming a resist lower layer film, of the present invention.
Figure 3:
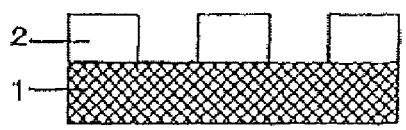
FIG. 3 is a schematic drawing which explains one step of the method for forming a dual damascene structure using the composition for forming a resist lower layer film, of the present invention.

After the transfer of the resist pattern onto the resist lower layer film, there is formed, as shown in FIG. 2, a resist pattern (trenches) is formed in the low dielectric insulating film 2 using the resist lower layer film 3 as a mask. The formation of the resist pattern of the low dielectric insulating film is conducted by removing the portion of the low dielectric insulating film, corresponding to the resist pattern, using reactive ion etching. FIG. 3 is a drawing showing a step of, after formation of a resist pattern in the dielectric insulating film 2, removing the resist lower layer film 3 by plasma asking.

Figure 4:
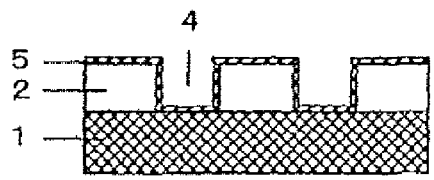
FIG. 4 is a schematic drawing which explains one step of the method for forming a dual damascene structure using the composition for forming a resist lower layer film, of the present invention.

As necessary, a barrier metal film may be formed on the low dielectric insulating film. FIG. 4 is a drawing showing a step of depositing a barrier metal 5 on the low dielectric insulating film 2 in which trenches (wiring grooves) 4 have been formed. By forming the barrier metal (barrier metal film), it is possible to improve the adhesivity between copper to be buried in the wiring grooves and the low dielectric insulating film and further prevent the migration of the copper into the low dielectric insulating film.

Figure 5:
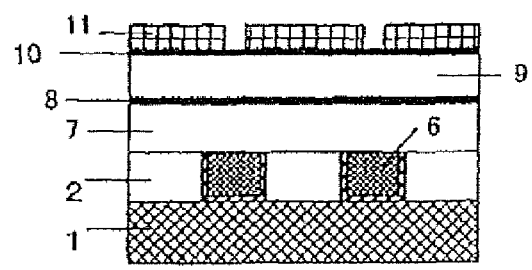
FIG. 5 is a schematic drawing which explains one step of the method for forming a dual damascene structure using the composition for forming a resist lower layer film, of the present invention.

Then, copper is buried in the wiring grooves by copper electroplating or the like, whereby a lower copper wiring layer can be formed. Incidentally, the low dielectric insulating film in which a resist pattern is formed, may be not only a single layer but also a multilayer wherein a plurality of low dielectric insulating films are laminated. FIG. 5 is a drawing showing a step of burying copper in the wiring grooves 4 by copper electroplating to form a lower copper wiring layer 6, removing the copper and the barrier metal 5 both adhering to the low dielectric insulating film 2 by chemical polishing (CMP), leveling the surface of the low dielectric insulating film 2, then forming, on the low dielectric insulating film 2, a first low dielectric insulating film 7, a first etching stopper film 8, a second low dielectric insulating film 9 and a second etching stopper film 10 in layers in this order, and forming a resist pattern in a resist lower layer film 11 on the uppermost etching stopper film 10.

Figure 6:
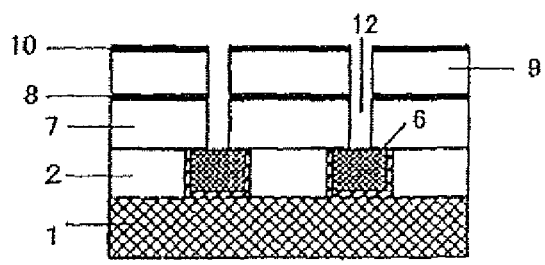
FIG. 6 is a schematic drawing which explains one step of the method for forming a dual damascene structure using the composition for forming a resist lower layer film, of the present invention.

Then, as shown in FIG. 6, reactive ion etching is conducted using the resist lower layer film 11 as a mask, to form via holes (a resist pattern) 12 which penetrate into the second etching stopper film 10, the second low dielectric insulating film 9, the first etching stopper layer 8 and the first low dielectric insulating film 7 and reaches the surface of the lower wiring layer 6; then, a plasma ashing treatment is conducted to remove the resist lower layer film.

Figure 7:
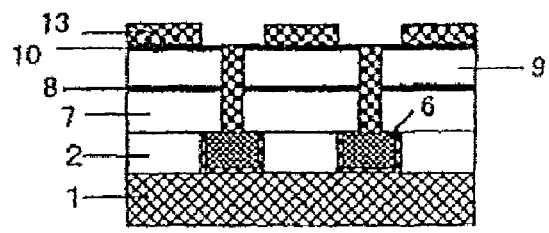
FIG. 7 is a schematic drawing which explains one step of the method for forming a dual damascene structure using the composition for forming a resist lower layer film, of the present invention.

Then, as shown in FIG. 7, a composition for formation of resist lower layer film is filled so as to bury the via holes 12; further, the composition for formation of resist lower layer film is coated so as to cover the second etching stopper 10 (the uppermost layer of laminate); and a resist pattern is again formed in the resulting resist lower layer film 13.

Figure 8:
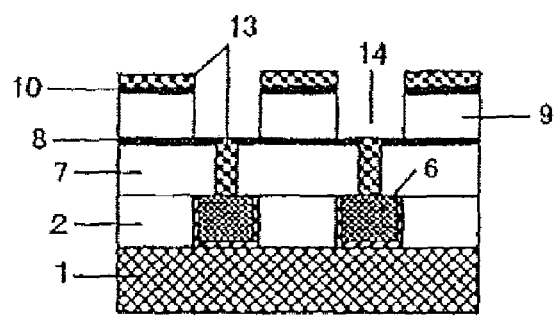
FIG. 8 is a schematic drawing which explains one step of the method for forming a dual damascene structure using the composition for forming a resist lower layer film, of the present invention.

Then, as shown in FIG. 8, reactive ion etching is conducted using the resist pattern of the resist lower layer film 13 as a mask, to etch the second etching stopper film 10 and the second low dielectric insulating film 9 to form trenches (resist patterns) 14.

Figure 9:
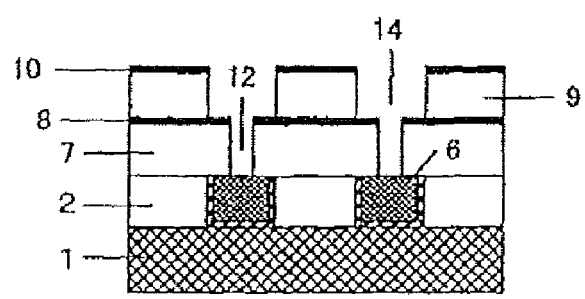
FIG. 9 is a schematic drawing which explains one step of the method for forming a dual damascene structure using the composition for forming a resist lower layer film, of the present invention.

After forming trenches (resist patterns) 14, the resist lower layer film 13 is removed by plasma ashing. FIG. 9 is a drawing showing a step of conducting an ashing treatment to completely remove the resist lower layer film in the via holes 12 and the resist pattern 13 of the resist lower layer film on the etching stopper film 10, to form a dual damascene structure having via holes 12 and trenches 14.

Figure 10:
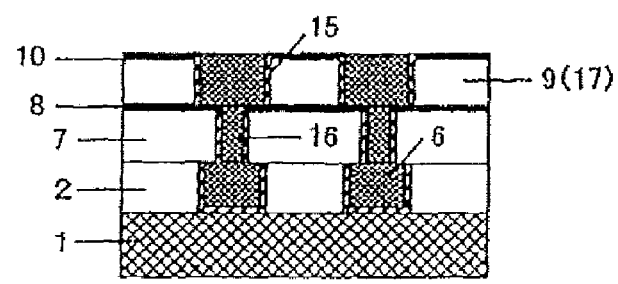
FIG. 10 is a sectional view showing state in which wiring has been conducted in the dual damascene structure formed using the composition for forming a resist lower layer film, of the present invention.

Then, as shown in FIG. 10, a barrier metal 15 is formed in the via holes 12 and the trenches 14; copper is buried in the holes and the trenches; CMP is conducted; thereby, via wirings 16 and an upper copper wiring layer 17 can be formed simultaneously.

Incidentally, the dual damascene structure can be formed not only in via first (mentioned above) but also in trench first. Also, various multilayer wiring structures can be formed by repeating the above-mentioned steps in order.

EXAMPLES

The embodiment of the present invention is described more specifically below by way of Examples. However, the present invention is in no way restricted to the Examples.

In the following, "parts" and "%" are based on mass unless otherwise specified.

[Measurement of Molecular Weight]

The polymers (A-1), (A-2) and (A-3) obtained in the following Synthesis Examples were measured for mass-average molecular weight (Mw) and number-average molecular weight (Mn) by gel permeation chromatography (detector: a differential refractometer) using a monodisperse polystyrene as standards, using GPC columns produced by Tosoh Corporation (G 2000 HXL: 2 columns, G 3000 HXL: 1 column) under the analytical conditions of flow rate=1.0 ml/min, elutant=tetrahydrofuran and column temperature=40° C.

Synthetic Example 1

Synthesis of Polymer (A-1)

Into a separable flask provided with a thermometer were fed, in a nitrogen atmosphere, 8 parts of acenaphthylene, 4 parts of 5-hydroxymethylacenaphylene, 50 parts of n-butyl acetate and 4 parts of azobisisobutyronitrile. Polymerization was conducted at 80° C. for 7 hours with stirring. Then, the reaction solution was diluted with 100 parts of n-butyl acetate, and the organic layer was washed with a large amount of water/methanol (mass ratio=1/2) mixed solvent. Then, the solvent was distilled off to obtain a polymer (A-1) having an Mw of 1,000.

Synthetic Example 2

Synthesis of Polymer (A-2)

Into a separable flask provided with a thermometer were fed, in a nitrogen atmosphere, 5 parts of acenaphthylene, 5 parts of 4-hydroxymethylstyrene, 48 parts of n-butyl acetate and 4 parts of azobisisobutyronitrile. Polymerization was conducted at 75° C. for 7 hours with stirring. Then, the reaction solution was diluted with 100 parts of n-butyl acetate, and the organic layer was washed with a large amount of water/methanol (mass ratio=1/2) mixed solvent. Then, the solvent was distilled off to obtain a polymer (A-2) having an Mw of 1,200.

Synthetic Example 3

Synthesis of Polymer (A-3)

Into a separable flask provided with a thermometer were fed, in a nitrogen atmosphere, 100 parts of 2,7-dihydroxynaphthalene, 100 parts of propylene glycol monomethyl ether acetate and 50 parts of paraformaldehyde, followed by addition of 2 parts of oxalic acid. The mixture was heated to 120° C. with dehydration, to conduct a reaction for 5 hours. Then, the reaction solution was diluted with 100 parts of n-butyl acetate, and the organic layer was washed with a large amount of water/methanol (mass ratio=1/2) mixed solvent. Then, the solvent was distilled off to obtain a polymer (A-3) having an Mw of 1,500.

Example 1

Preparation of Composition for Formation of Resist Lower Layer Film

In 89 parts of ethyl lactate (expressed as "C-1" in Table 1) as a solvent were dissolved 10 parts of the polymer (A-1), 0.5 part of tetrabutoxymethylglycoluril (represented by the following formula (7); expressed as "B-1" in Table 1) as a crosslinking agent, and 0.5 part of bis(4-t-butylphenyl)iodonium nonafluoro-n-butanesulfonate (represented by the following formula (7); expressed as "D-1" in Table 1) as an acid-generating agent, to obtain a mixed solution. Then, the mixed solution was filtered through a membrane filter having a pore diameter of 0.1 µm, to obtain a composition for formation of resist lower layer film. The composition for formation of resist lower layer film was used as a coating fluid, for the following evaluations.

[Chemical formula 13]

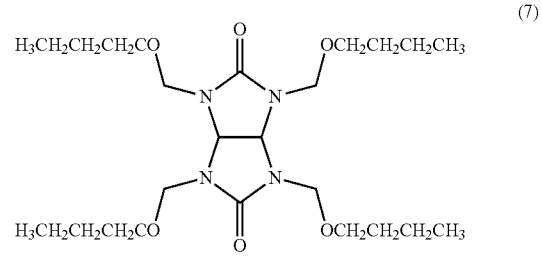

(7)

TABLE 1

| | | | Formulation | | | | | | Evaluation | | | |
| | | | Crosslinking | | | | Acid-generating | | Etching | | Amount of | |
| | Resin | | agent | | Solvent | | agent | | resistance | | sublimation | |
| | | Amount | | Amount | | Amount | | Amount | Etching rate | Filling | product | |
| | Polymer | (parts) | Kind | (parts) | Kind | (parts) | Kind | (parts) | (nm/min) | property | (mg) | |
|---|---|---|---|---|---|---|---|---|---|---|---|---|
| Ex. 1 | A-1 | 10 | B-1 | 0.5 | C-1 | 89.0 | D-1 | 0.5 | 67 | ○ | ○ | 1.8 | ○ |
| Ex. 2 | A-1 | 10 | B-1 | 1.0 | C-1 | 88.5 | D-1 | 0.5 | 67 | ○ | ○ | 2.1 | ○ |
| Ex. 3 | A-1 | 10 | B-2 | 0.5 | C-1 | 89.0 | D-1 | 0.5 | 65 | ○ | ○ | 0.8 | ○ |
| Ex. 4 | A-2 | 10 | B-2 | 1.0 | C-1 | 88.5 | D-1 | 0.5 | 69 | ○ | ○ | 0.9 | ○ |
| Ex. 5 | A-2 | 10 | B-1 | 0.5 | C-1 | 89.0 | D-1 | 0.5 | 69 | ○ | ○ | 1.2 | ○ |
| Ex. 6 | A-2 | 10 | B-1 | 1.0 | C-1 | 88.5 | D-1 | 0.5 | 69 | ○ | ○ | 1.4 | ○ |
| Ex. 7 | A-3 | 10 | B-1 | 0.5 | C-1 | 89.0 | D-1 | 0.5 | 73 | ○ | ○ | 0.5 | ○ |
| Ex. 8 | A-3 | 10 | B-2 | 0.5 | C-1 | 89.0 | D-1 | 0.5 | 72 | ○ | ○ | 0.7 | ○ |
| Ex. 9 | A-4 | 10 | B-2 | 0.5 | C-1 | 89.0 | D-1 | 0.5 | 72 | ○ | ○ | 1.1 | ○ |
| Ex. 10 | A-4 | 10 | B-2 | 1.0 | C-1 | 88.5 | D-1 | 0.5 | 72 | ○ | ○ | 2.0 | ○ |
| Ex. 11 | A-1 | 10 | B-1 | 0.5 | C-1 | 89.5 | — | — | 71 | ○ | ○ | 0.6 | ○ |
| Ex. 12 | A-2 | 10 | B-1 | 0.5 | C-1 | 89.5 | — | — | 63 | ○ | ○ | 0.4 | ○ |
| Comp. Ex. 1 | A-1 | 10 | — | — | C-1 | 90.0 | — | — | 66 | ○ | X | 1.2 | ○ |
| Comp. Ex. 2 | A-1 | 10 | — | — | C-1 | 89.5 | D-1 | 0.5 | 72 | ○ | X | 2.3 | ○ |
| Comp. Ex. 3 | A-1 | 10 | B-3 | 0.5 | C-1 | 89.0 | D-1 | 0.5 | 72 | ○ | ○ | 8.2 | X |
| Comp. Ex. 4 | A-1 | 10 | B-4 | 0.5 | C-1 | 89.0 | D-1 | 0.5 | 70 | ○ | ○ | 8.1 | X |
| Comp. Ex. 5 | A-2 | 10 | B-3 | 0.5 | C-1 | 89.0 | D-1 | 0.5 | 70 | ○ | ○ | 6.5 | X |
| Comp. Ex. 6 | A-3 | 10 | B-3 | 0.5 | C-1 | 89.0 | D-1 | 0.5 | 75 | ○ | ○ | 5.3 | X |
| Comp. Ex. 7 | A-4 | 10 | — | — | C-1 | 89.0 | — | — | 100 | X | ○ | 2.3 | ○ |

[Filling-into-Via Property]

The above-obtained composition for formation of resist lower layer film was evaluated for filling-into-via property, that is, whether or not the composition was penetrated and filled into via holes satisfactorily. The evaluation of filling-into-via property was made by the following method.

First, a composition for formation of resist lower layer film was spin-coated on a tetraethyl ortho-silicate (TEOS) substrate in which via holes of via size=100 nm, via pitch=1H/1.2S and depth=1,000 nm had been formed by processing. Thereafter, heating was conducted at 180° C. for 60 seconds, followed by heating on a hot plate at 250° C. for 60 seconds. In this manner, a resist lower layer film of 300 nm in thickness was formed in the via holes and on the TEOS substrate. The resist lower layer film was observed and evaluated by a scanning electron microscope, for the state of filling-into-via hole. When the resist lower layer film was formed (buried) in the via holes, the filling-into-via property was expressed as good (○) and, when there was no filling, the filling-into-via property was expressed as bad (X).

[Etching Resistance]

The resist lower layer film made from a composition for formation of resist lower layer film was evaluated for pattern transfer ability and etching resistance, by the following method. First, a resist lower layer film of 300 nm in thickness was formed by spin-coating. Then, the resist lower layer film was subjected to an etching treatment (pressure: 0.03 Torr, high frequency electric power: 3,000 W, Ar/CF4=40/100 sccm, substrate temperature=20° C.), and the thickness of the resist lower layer film after the etching treatment was measured. The etching rate (nm/min) of the resist lower layer film was calculated form the relation between the reduction amount of film thickness and the treatment time. When the etching rate was 80 nm/min or less, the etching resistance was rated as good (○) and, when the etching rate exceeded 80 nm/min, the etching resistance was rated as bad (X).

[Amount of Sublimation Product]

A composition for formation of resist lower layer film was spin-coated on a silicon wafer of 8 in. in diameter. Thereafter, heating was conducted at 180° C. for 60 seconds, followed by heating on a hot plate at 250° C. for 60 seconds, to produce a resist lower layer film of 300 nm in thickness. The amount of the sublimation product which appeared during the production, was measured. In order to capture the sublimation product, an 8-inch silicon wafer was adhered to the ceiling cover of the hot plate; a resist lower layer film was coated 100 times; then, the weight of the sublimation product deposited on the 8-inch wafer was measured. An amount of sublimation product, of 2.5 mg or less was evaluated as good (○), and an amount exceeding 2.5 mg was evaluated as bad (X).

Examples 2 to 12

Compositions for formation of resist lower layer film were produced in the same manner as in Example 1 except that formulations shown in Table 1 were used. Incidentally, in Table 1, "A-4" is a polyhydroxystyrene (trade name: MURUKA LYNCUR, a product of Maruzen Petrochemical Co., Ltd.), and "B-2" is n-butyl-etherified hexamethylolmelamine represented by the following formula (8).

[Chemical formula 14]

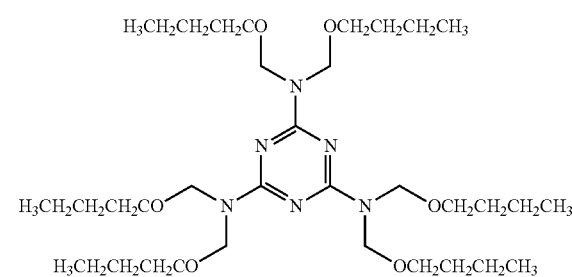

(8)

Comparative Examples 1 to 7

Compositions for formation of resist lower layer film were produced in the same manner as in Example 1 except that formulations shown in Table 1 were used. Incidentally, in Table 1, "B-3" is tetramethoxymethylglycoluril represented by the following formula (9), and "B-4" is methylol hexamethylolmelamine represented by the following formula (10).

[Chemical formula 15]

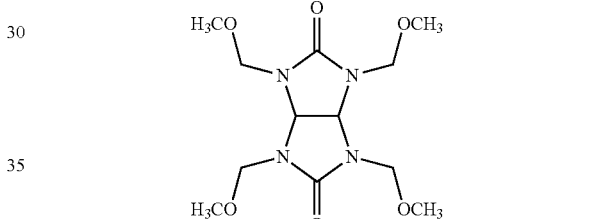

(9)

[Chemical formula 16]

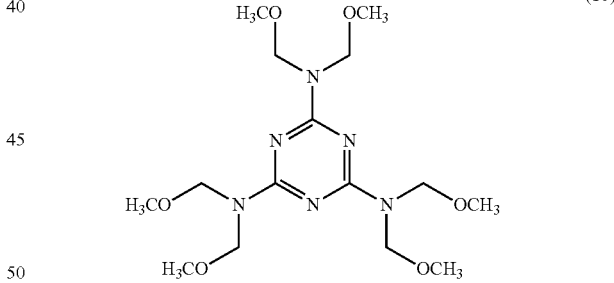

(10)

The compositions for formation of resist lower layer film, of Examples 1 to 12 and the compositions for formation of resist lower layer film, of Comparative Examples 1 to 7 were evaluated for the above-mentioned items. The results of evaluation are shown in Table 1.

As shown in Table 1, the resist lower layer films made from the compositions for formation of resist lower layer film, of Examples 1 to 12 contained a butyl ether group-containing crosslinking agent and therefore were superior in filling property and small in amount of sublimation product although the compositions contained a resin of good etching resistance.

The resist lower layer films made from the compositions for formation of resist lower layer film, of Comparative Examples 1 to 2 showed good etching resistance because the compositions, similarly to the compositions of Examples 1 to 12, contained a resin of good etching resistance but, owing to no presence of crosslinking agent, were bad in filling property. Meanwhile, the resist lower layer films made from the compositions for formation of resist lower layer film, of Comparative Examples 3 to 6 showed good etching resistance and good filling property because the compositions, similarly to the compositions for formation of lower layer resist film, of Examples 1 to 12, contained a resin of good etching resistance; however, the compositions of Comparative Examples 3 to 6, as compared with the compositions for formation of lower layer resist film, of Examples 1 to 12, were large in amount of sublimation product because the compositions of Comparative Examples 3 to 6 contained no butyl ether group-containing crosslinking agent.

The composition for formation of lower layer resist film, of Comparative Example 7 contained a resin of low glass transition temperature and therefore was good in filling property and small in amount of sublimation product, but had no etching resistance required for resist lower layer film.

INDUSTRIAL APPLICABILITY

The composition for formation of resist lower layer film, of the present invention contains a butyl ether group-containing crosslinking agent and therefore is good in filling property, small in amount of sublimation product, and good in etching property; therefore, the composition can form a superior resist lower layer film. Hence, the composition for formation of resist lower layer film, of the present invention can be suitably used in formation of a dual damascene structure in large scale integrated circuit.

The invention claimed is:

1. A composition for forming a resist lower layer film, which contains (A) a resin, (B) a butyl ether group-containing crosslinking agent and (C) a solvent, wherein the resin (A) is a polymer having at least one structural unit selected from the group of the structural units represented by the following formulas (3) to (6):

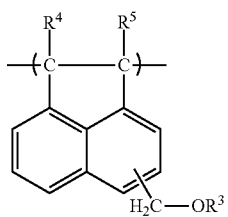

(3)

$R^3$ is a hydrogen atom or a monovalent organic group; and $R^4$ and $R^5$ are each independently a monovalent atom or a monovalent organic group;

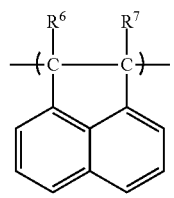

(4)

$R^6$ and $R^7$ are each independently a monovalent atom or a monovalent organic roup;

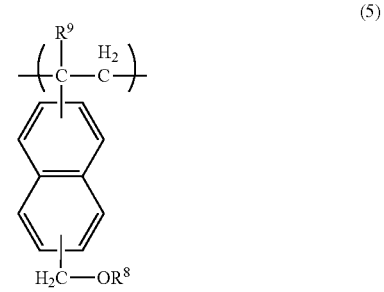

(5)

$R^8$ is a hydrogen atom or a monovalent organic group, and $R^9$ is a monovalent atom or a monovalent organic group;

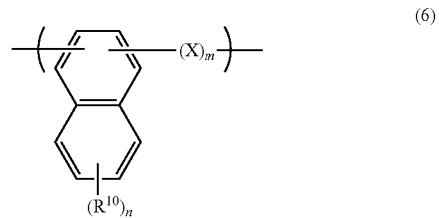

(6)

$R^{10}$s are a hydroxyl group, an alkyl group which may have a substituent of 1 to 6 carbon atoms, an alkoxy group which may have a substituent of 1 to 6 carbon atoms, an alkoxycarbonyl group which may have a substituent of 2 to 10 carbon atoms, an aryl group which may have a substituent of 6 to 14 carbon atoms, or a glycidyl ether group which may have a substituent of 2 to 6 carbon atoms; n is an integer of 0 to 6; when n is 2 to 6, a plurality of $R^{10}$s may be the same or different from each other; X is a methylene group, an alkylene group which may have a substituent of 2 to 20 carbon atoms, an arylene group which may have a substituent of 6 to 14 carbon atoms, or an alkylene ether group; m is an integer of 1 to 8; when m is 2 to 8, a plurality of Xs may be the same or different from each other; and n+m is an integer of 1 to 8, wherein the butyl ether group-containing crosslinking agent (B) is a nitrogen-containing cyclic compound having at least two butyl ether groups.

2. The composition for forming a resist lower layer film, according to claim 1, wherein the nitrogen-containing cyclic compound is a compound having a glycoluril skeleton or a triazine skeleton.

3. The composition for forming a resist lower layer film, according to claim 1, wherein the butyl ether group-containing crosslinking agent (B) is at least one kind of compound selected from the group of the compounds represented by the following formulas (1) and (2):

[Chemical formula 1]

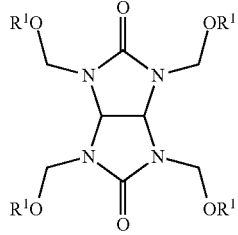

(1)

R$^1$s are each independently a hydrogen atom, a methyl group, an ethyl group, a propyl group or a butyl group, with a proviso that at least two R$^1$s are each a butyl group;

[Chemical formula 2]

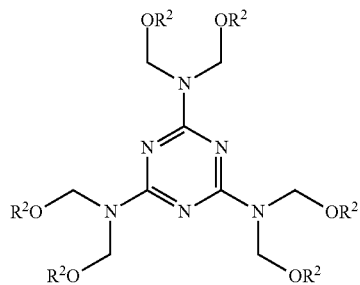

(2)

R$^2$s are each independently a hydrogen atom, a methyl group, an ethyl group, a propyl group or a butyl group, with a proviso that at least two R$^2$s are each a butyl group.

* * * * *